US006580173B2

United States Patent
Okada et al.

(10) Patent No.: US 6,580,173 B2
(45) Date of Patent: Jun. 17, 2003

(54) SEMICONDUCTOR DEVICE AND MANUFACTURING METHOD OF SEMICONDUCTOR DEVICE

(75) Inventors: Akira Okada, Kawasaki (JP); Tetsuya Hiraoka, Kawasaki (JP); Kazuyuki Aiba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/727,760

(22) Filed: Dec. 4, 2000

(65) Prior Publication Data

US 2001/0042908 A1 Nov. 22, 2001

(30) Foreign Application Priority Data

May 18, 2000 (JP) ........................................ 2000-146850

(51) Int. Cl.⁷ ........................... H01L 23/48; H01L 23/52
(52) U.S. Cl. ........................................ 257/774; 257/783
(58) Field of Search ................................... 257/783, 793, 257/773, 774, 678; 438/118, 637, 668

(56) References Cited

U.S. PATENT DOCUMENTS 5,917,234 A  *  6/1999  Tsuruzono .................. 257/667
6,054,755 A  *  4/2000  Takamichi et al. .......... 257/667
6,242,802 B1 *  6/2001  Miles et al. ................ 257/738

* cited by examiner

*Primary Examiner*—Tom Thomas
*Assistant Examiner*—Douglas W. Owens
(74) *Attorney, Agent, or Firm*—Armstrong, Westerman & Hattori, LLP

(57) ABSTRACT

A substrate of a semiconductor device has a first surface on which a semiconductor element is fixed and a second surface opposite to the first surface. An adhesive is provided between the semiconductor element and the first surface of the substrate. At least one though hole is formed which extends between the first surface and the second surface of the substrate. A pattern member is formed on the first surface of the substrate so as to cover a part of an opening of the through hole.

4 Claims, 6 Drawing Sheets

_US 6,580,173 B2_

SEMICONDUCTOR DEVICE AND MANUFACTURING METHOD OF SEMICONDUCTOR DEVICE

BACKGROUND OF THE INVENTION

1. Field of the Invention

The present invention generally relates to semiconductor devices and, more particularly, to a semiconductor device using an organic substrate formed by an organic material such as a resin material.

The organic substrate is used for substrates of semiconductor devices due to its easiness in handling and processing. As a typical organic substrate, there is a glass-epoxy substrate or a polyimide substrate. In a semiconductor device using the organic substrate, it is general to fix a semiconductor chip to the organic substrate by an adhesive.

However, the organic substrate has a high moisture-absorption characteristic, thereby having a nature to easily absorb moisture in an atmosphere. An amount of moisture absorbed by the organic substrate can be reduced if the semiconductor device is stored in a low humidity atmosphere. However, there may be a problem related to a static electricity if the humidity is low. Thus, it is required to maintain the humidity at a certain level.

Accordingly, the organic substrate is used on the assumption that the organic substrate absorbs a certain amount of moisture, and a semiconductor device using an organic substrate is generally provided with means for preventing problems caused by moisture absorbed by the organic substrate.

2. Description of the Related Art

The moisture absorbed by an organic substrate in a semiconductor device remains at an interface between the organic material and an adhesive or under fill material that fixes a semiconductor chip onto the organic substrate. When such moisture is heated due to a heat for mounting the semiconductor device, the moisture is abruptly evaporated, which increases an inner pressure. Thus, there is a problem in that the adhesive is separated from the organic substrate at the interface therebetween. Such a separation is referred to as a popcorn phenomenon.

As measures for preventing the popcorn phenomenon, a method is used in which a plurality of small though holes generally referred to as vent holes are formed in the organic substrate so as to release a water vapor, which is generated at the interface between the adhesive and the organic substrate, via the through holes.

FIG. 1 is a cross-sectional view of a conventional semiconductor device produced by a wire bonding method. A semiconductor chip 2 is fixed to an organic substrate 6 via an adhesive 4. Electrodes of the semiconductor chip 2 are connected by bonding wires 8 to electrode pads 10 formed on the organic substrate 6, respectively. The semiconductor chip 2 and the bonding wires 8 are encapsulated by a seal resin 12. Additionally, the electrode pads 10 of the organic substrate 6 are electrically connected to solder balls 14, which are external connection electrodes, via a circuit pattern (not shown in the figure) formed on the organic substrate 6.

In the semiconductor device shown in FIG. 1, a plurality of vent holes 16, which are through holes, are previously formed in the organic substrate 6 so as to prevent the above-mentioned popcorn phenomenon. Since the vent holes 16 are formed by punching or drilling, a diameter of each of the vent holes 16 ranges from 0.1 mm to 0.3 mm. The semiconductor device is formed by fixing the semiconductor chip 2 by the adhesive 4 onto the organic substrate 6 having the thus-formed vent holes 16.

Additionally, there is a method in which the vent holes 16 are not previously formed on the organic substrate 6 but a plurality of through holes are formed as the vent holes 16 in the organic substrate 16 by using a laser apparatus 18 after fixing the semiconductor chip 2 to the organic substrate 6 and encapsulating by a resin.

FIG. 3 is a cross-sectional view of a conventional semiconductor device produced by a flip chip method. The semiconductor chip 2 is mounted to the organic substrate 6 by bonding stud electrodes 20 to the electrode pads 10 formed on the organic substrate 6. An under fill material 22 is filed between the semiconductor chip 2 and the organic substrate 6 so as to securely fix the semiconductor chip 2 to the organic substrate 6. Additionally, the electrode pads 10 of the organic substrate 6 is electrically connected to the solder balls 14, which are external connection electrodes, via the circuit pattern (not shown in the figure) formed on the organic substrate 6. The under fill material 22 corresponds to the adhesive 4 in FIG. 1.

Accordingly, similar to the semiconductor device shown in FIG. 1, the vent holes, which are a plurality of through holes, are previously formed in the organic substrate 6. Since the vent holes 16 are formed by punching or drilling, a diameter of each of the vent holes 16 ranges from 0.1 mm to 0.3 mm. The semiconductor device is formed by fixing the semiconductor chip 2 onto the organic substrate 6 having the thus-formed vent holes 16 and filling the under fill material 22 between the organic material 6 and the semiconductor chip 2.

Additionally, there is a method in which the vent holes 16 are not previously formed on the organic substrate 6 but a plurality of through holes are formed as the vent holes 16 in the organic substrate 16 by using the laser apparatus 18 after fixing the semiconductor chip 2 onto the organic substrate 6.

In the semiconductor device shown in FIG. 1, since the vent holes 16 are previously formed in the organic substrate 6, there is a problem in that the adhesive 4 leaks through the vent holes 16 when the liquid or paste-like adhesive 4 before curing is supplied between the semiconductor chip 2 and the organic substrate 6.

The adhesive 4 is mixed with filler having a particle diameter ranging from 50 $\mu$m to 60 $\mu$m, and, thus, the filler easily passes through the vent holes 16, and the vent holes 16 are not clogged by the filler. However, the leakage of the adhesive 4 cannot be prevented by the filler.

If the adhesive 4 leaks through the vent holes 16, the leaking adhesive may cause a problem during a mounting operation of the semiconductor device. That is, the leaked and cured adhesive 4 may adhere to the electrodes of the mounting substrate when the semiconductor device is mounted onto the mounting substrate, which may cause incomplete soldering.

In order to eliminate the above-mentioned problem caused by the leakage of the adhesive 4, the vent holes 16 are formed by laser machining after the adhesive 4 is cured as shown in FIG. 2. Thereby, the leakage of the adhesive 4 can be prevented, but there is a problem in that a surface of the semiconductor chip 2 is damaged by a laser beam penetrating the adhesive 4 and reaching the surface of the semiconductor chip 2. In recent years, semiconductor chips have become thin, and, therefore, a crack may be generated in the semiconductor chip 2 when the semiconductor chip receives only a small damage. When the semiconductor chip 2 receives damage, an operation failure may occur in the semiconductor device.

Additionally, in the semiconductor device shown in FIG. 3, there is the same problem as the above-mentioned semiconductor device shown in FIG. 3. That is, in a case in which the vent holes 16 are previously formed in the organic substrate 6, there is a problem in that the under fill material 22 leaks through the vent holes 16. Additionally, as shown in FIG. 4, in a case in which the vent holes 16 are formed in the organic substrate 6 by laser machining after the under fill material is cured, the surface of the semiconductor chip 2 may be damaged by the laser beam.

Especially, in the semiconductor chip produced by the flip chip mounting as shown in FIGS. 3 and 4, since the circuit forming surface of the semiconductor chip 2 faces the organic substrate 6, the circuit forming surface is damaged by the laser machining. Accordingly, the circuit of the semiconductor chip is directly influenced even if the damage is very small, which results in an operation failure of the semiconductor device.

SUMMARY OF THE INVENTION

It is a general object of the present invention to provide a semiconductor device in which the above-mentioned problems are eliminated.

A more specific object of the present invention is to provide a semiconductor device having vent holes through which an adhesive or under fill material does not leak.

In order to achieve the above-mentioned objects, there is provided according to one aspect of the present invention a semiconductor device comprising:

a semiconductor element;
a substrate having a first surface on which the semiconductor element is fixed and a second surface opposite to the first surface;
an adhesive provided between the semiconductor element and the first surface of the substrate;
at least one though hole extending between the first surface and the second surface of the substrate; and
a pattern member formed on the first surface of the substrate so as to cover a part of an opening of the through hole.

According to the present invention, since the pattern member formed on the first surface of the substrate partially covers the opening of the through hole of the substrate, the diameter of the through hole is substantially reduced. Accordingly, the presence of the pattern member prevents the adhesive from leaking though the though hole even if the actual size of the through hole is such that the adhesive easily passes though the through hole. The pattern member partially covers the through hole, and, thereby, a part of the though hole is open to the adhesive retained on the first surface of the substrate. Accordingly, the water vapor generated at an interface between the first surface of the substrate and the adhesive can be discharged through the through hole.

In the semiconductor device according to the present invention, the pattern member may be formed of the same material as electrode pads formed on the first surface of the substrate. Accordingly, there is no need to provide a separate process so as to form the pattern member. Thus, the semiconductor device according to the present invention can be achieved without increasing a manufacturing cost.

Additionally, the pattern member may be a circuit pattern formed on the first surface of the substrate so that there is no need to provide the pattern member only for partially closing the through hole. That is, the circuit pattern partially covers the through hole, and, thereby, the diameter of the through hole is substantially reduced. Accordingly, the presence of the circuit pattern prevents the adhesive from leaking though the though hole even if the actual size of the through hole is such that the adhesive easily passes though the through hole. Additionally, there is no need to provide the though hole at a position which avoids the circuit pattern as in the conventional device, thereby improving a freedom of design of the substrate.

Additionally, in the semiconductor device according to the present invention, the substrate may be an organic substrate formed of an organic material. The organic substrate is inexpensive and can be easily handled. However, the organic substrate has a drawback in that it has a high moisture-absorbing characteristic. The moisture absorbed by the substrate stays between the adhesive and the substrate, and causes a problem in that the adhesive is separated from the substrate by an abrupt evaporation due to heating for mounting the semiconductor device. Accordingly, by forming the pattern member on the organic substrate so as to partially cover the though hole for discharging the water vapor, the semiconductor device can be manufactured at a low cost without increasing the manufacturing cost while compensating for the drawback of the organic substrate.

Additionally, there is provided according to another aspect of the present invention a manufacturing method of a semiconductor device, comprising the steps of:

forming a pattern member by a metal on a first surface of a substrate;
fixing a semiconductor element onto the first surface of the substrate; and
irradiate a laser beam onto a position at which the pattern member is formed from a side of a second surface opposite to the first surface of the substrate so as to form a vent hole that penetrates the substrate.

According to the above-mentioned manufacturing method, the adhesive does not leak from the through hole since the though hole is formed by laser machining after the adhesive has been cured. Additionally, since a metal-made pattern member, which reflects a laser beam, is formed on a portion of the substrate facing the adhesive at which the laser machining is applied, the semiconductor element is prevented from being damaged by the laser beam even if an excess laser beam is irradiated onto the semiconductor element after the formation of the though hole is completed. Thus, the though hole can be formed while the semiconductor is prevented from being damaged without increasing an accuracy of control of the laser beam power.

Other objects, features and advantages of the present invention will become more apparent from the following detailed description when read in conjunction with the accompanying drawings.

DETAILED DESCRIPTION OF THE PREFERRED EMBODIMENTS

A description will now be given, with reference to the drawings, of a first embodiment of the present invention.

Figure 1:
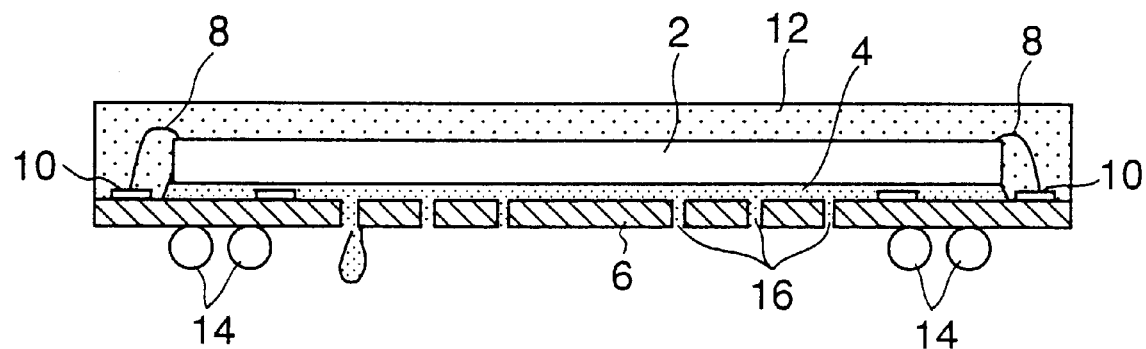
FIG. 1 is a cross-sectional view of a conventional semiconductor device manufactured by a wire bonding method.
Figure 2:
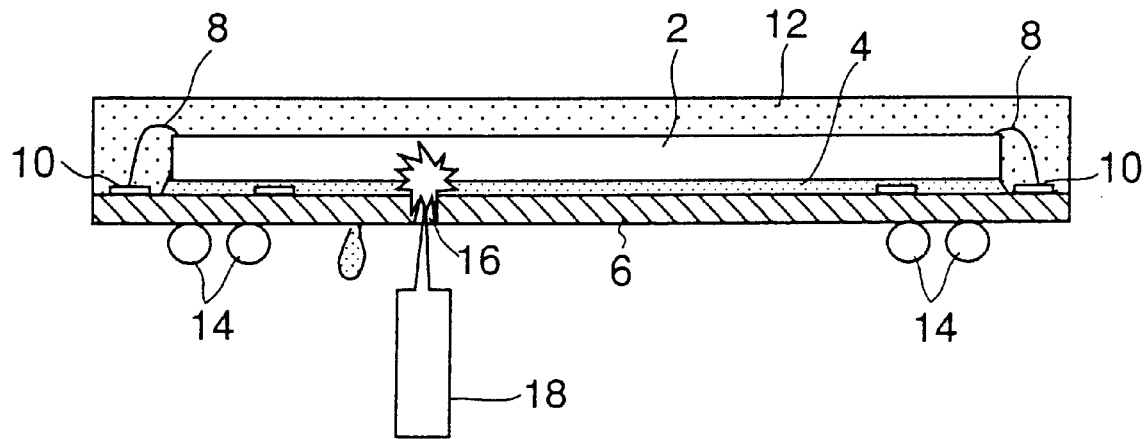
FIG. 2 is a cross-sectional view of the semiconductor device shown in FIG. 1 for showing a process of forming a vent hole by laser machining.
Figure 3:
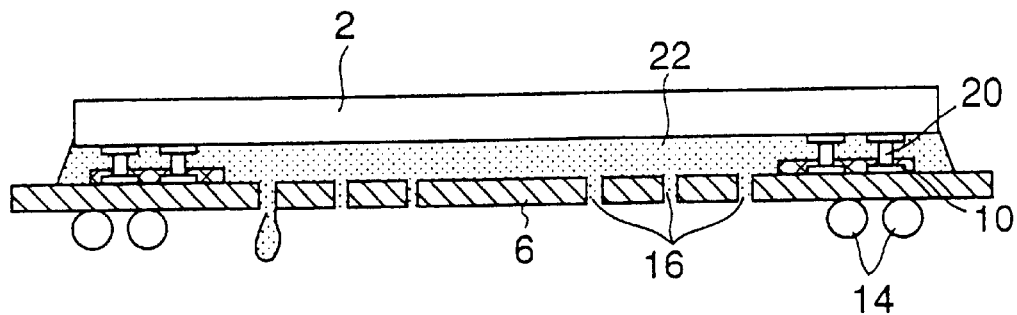
FIG. 3 is a cross-sectional view of a conventional semiconductor device manufactured by a flip chip bonding method.
Figure 4:
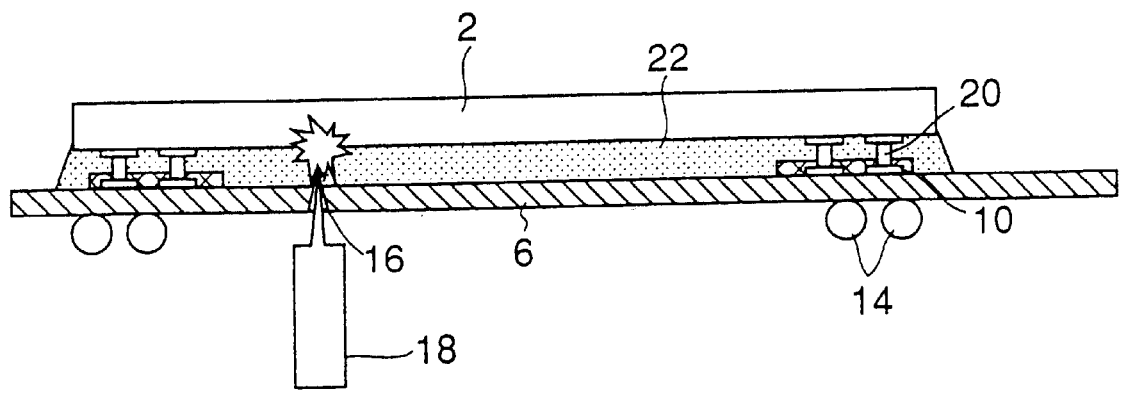
FIG. 4 is a cross-sectional view of the semiconductor device shown in FIG. 3 for showing a process of forming a vent hole by laser machining.
Figure 5:
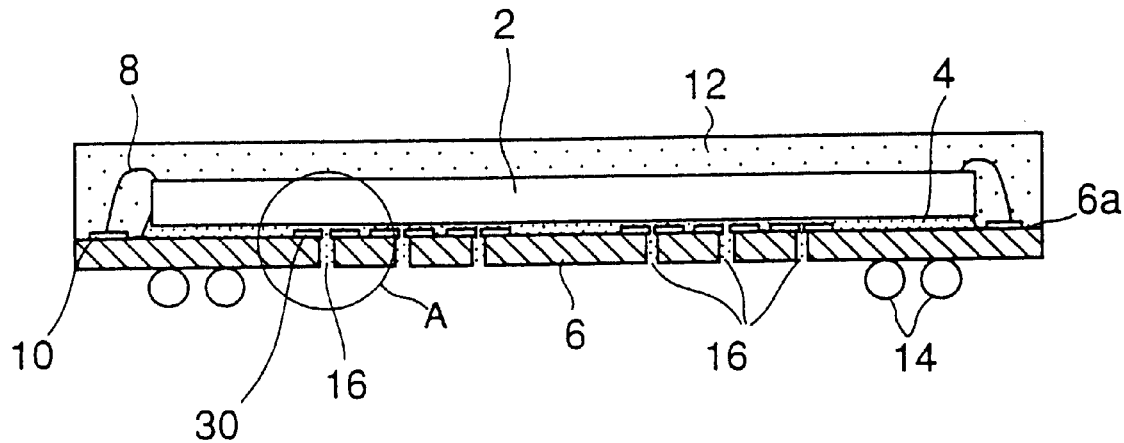
FIG. 5 is a cross-sectional view of a semiconductor device according to a first embodiment of the present invention.

FIG. 5 is a cross-sectional view of a semiconductor device according to the first embodiment of the present invention. In FIG. 5, parts that are the same as the parts shown in FIG. 1 are given the same reference numerals, and descriptions thereof will be omitted.

Similar to the semiconductor device shown in FIG. 1, the semiconductor device shown in FIG. 5 has a plurality of vent holes (through holes) 16 previously formed in an organic substrate 6 (hereinafter simply referred to as a substrate). Each of the vent holes 16 is formed by punching or drilling, and a diameter thereof ranges from 0.1 mm to 0.3 mm. The vent holes 16 serve as through holes for discharging water vapor.

An inner surface of the substrate 6, that is, a surface 6a opposite to the semiconductor chip 2 is provided with pattern members 30, and each of the vent holes 16 are formed underneath the pattern members 30. That is, each of the vent holes 16 is covered by respective one of the pattern members 30, and a small hole having a diameter smaller than the diameter of each of the vent holes 16 is formed in the center of each of the pattern members 30. Accordingly, the adhesive 4 is connected to each of the vent holes 16 via the small hole formed in the respective one of the pattern members 30.

Figure 6:
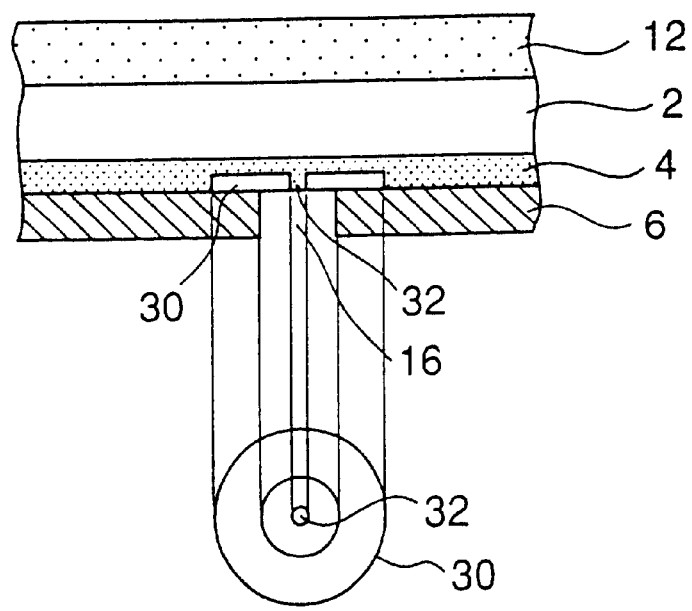
FIG. 6 is a cross-sectional view of a pattern member shown in FIG. 5.

FIG. 6 is an enlarged cross-sectional view of a part of the substrate 6 shown in FIG. 5 in which part the pattern member 30 is provided. In FIG. 6, a plan view of the pattern member 30 is also indicated. As shown in FIG. 6, the pattern member 30 is formed in a circular shape having a diameter larger than the diameter of the vent hole 16 so that the pattern member 30, which is formed on the surface 6a of the substrate 6, covers the entire vent hole 16.

The above-mentioned small hole 32 is provided in the center of the pattern member 30, and the adhesive 4 is exposed in the small hole 32. The diameter of the small hole 32 can be formed sufficiently smaller than the diameter of the vent hole 16. For example, if the diameter of the small hole 32 is made about 50 µm, the liquefied or paste-like adhesive 4 before being cured does not flow toward the vent hole 16 since the diameter of the small hole 32 is sufficiently small.

The small hole 32 serves as a sufficiently large hole with respect to water vapor. Accordingly, if the above-mentioned popcorn phenomenon occurs and the separation of the adhesive 4 due to the water vapor spreads along the interface between the surface 6a of the substrate 6 and the adhesive 4, the water vapor is discharged from the small hoe 32 to the vent hole 16 when the separation reaches the small hole 32 of the pattern member 30. Thereby, an inner pressure due to the water vapor is decreased, and the separation due to the generation of the water vapor does not spread beyond the small hole 32.

Accordingly, by providing many small holes 32 (including the vent holes 16) on the substrate 6, the separation can be kept within a small range even if the popcorn phenomenon occurs. Thus, the semiconductor device can be prevented from being adversely affected by the adhesive 4. That is, the formation of the pattern member 30 having the small hole 32 on the vent hole 16 can prevent the separation of the adhesive 4 while preventing the adhesive from leaking.

In the present embodiment, the pattern members 30 are formed at the same time the electrode pads 10 are formed on the substrate 6. That is, the pattern members 30 are formed of a material the same as the material of the electrode pads 10. For example, the pattern members 30 can be formed by patterning a copper plate of copper foil applied to the surface 6a of the substrate 6. Thus, the pattern members 30 can be formed in the process of forming the electrode pads 10, and there is no need to separately provide a process of forming the pattern members 30.

In order to form the pattern members 30, first the vent holes 16 are formed in the substrate 6, and, then, a copper plate or copper foil is applied to the surface 6a of the substrate 6 so as to cover the vent holes 16. The vent holes 16 are formed by the conventional method such as punching or drilling, and each of the vent holes 16 can be set to an arbitrary size. That is, the diameter of each of the through holes 16 may be set in a range from 0.1 mm to 0.3 mm, or may be set to a larger diameter. After the copper plate or copper foil is applied to the substrate 6, the copper plate or copper foil is patterned by etching so as to form both the electrode pads 10 and the pattern members 30.

It should be noted that the small hole in the center of each of the pattern members 30 can be formed by etching, or may be formed by laser machining after formation of the pattern members 30. In the example shown in FIG. 6, the small hole 32 is formed in the center of each of the pattern members 30, which position corresponds to the center of each of the vent holes 16. However the position of the small hole 32 is not limited to the center of each of the pattern members 30, and the small hole 32 can be formed at an arbitrary position on each of the pattern members 30 if the small hole 32 can be connected to the respective one of the vent holes 16.

Additionally, although the pattern members 30 are formed by the same material as the electrode pads 10 in the present embodiment, the material of the pattern members 30 is not limited to the material of the electrode pads 10. That is, the pattern members 30 may be formed by a material different form the material of the electrode pads 10 in a different process. Additionally, the diameter of the small hole 32 can be set to an arbitrary size. That is, the diameter of the small hole 32 may be preferably determined based on a viscosity of the adhesive 4 to be used or a diameter of filler particles added to the adhesive 4.

Additionally, although the vent holes 16 are previously formed in the substrate 6 in the above-mentioned embodiment, only the pattern members 30 may be previously formed on the substrate 6 so as to form the vent holes 16 later by laser machining.

Specifically, first the pattern members 30 each having the small hole 32 are formed on the substrate 6, and, then, the semiconductor chip 2 is fixed on the surface 6a of the substrate 6 via the adhesive 4. After the adhesive is cured, the vent holes 16 are formed by irradiating a laser beam onto positions corresponding to the pattern members 30.

According to the above-mentioned method, the semiconductor chip 2 can be prevented from being damaged by a laser beam passing through the adhesive 4. Since the pattern members 30 are previously formed at positions where the vent holes 16 are formed by a leaser beam, an excess laser beam continuously irradiated after the removal of the substrate 6 is almost completely reflected by the pattern members 30. That is, the pattern members 30 are formed by a metal (copper) which has a characteristic to reflect a laser beam. Accordingly, the excess laser beam after the completion of formation of the vent holes 16 is reflected by the pattern members 30 and does not reach the adhesive 4. Thus, there is no possibility to damage the semiconductor chip 2.

Since the small hole 32 is formed in each of the pattern members 30, the laser beam irradiated at the position of the small hole 32 may slightly damage the adhesive 4. However, since the diameter of the small hole 32 is very small and the laser power passing through the small hole 32 is small. Thus, the laser beam passed through the small hole cannot pass trough the adhesive 4 and cannot reach the semiconductor chip 2.

As mentioned above, by previously forming the pattern members 30 on the substrate 6, the semiconductor chip 2 can be prevented from being damaged by an excessively irradiated laser beam without an accurate control of the power and duration of the laser beam to be irradiated even when the vent holes 16 are formed in the substrate 6 by laser machining after the semiconductor chip 2 is fixed onto the substrate 6 by the adhesive 4.

Figure 7:
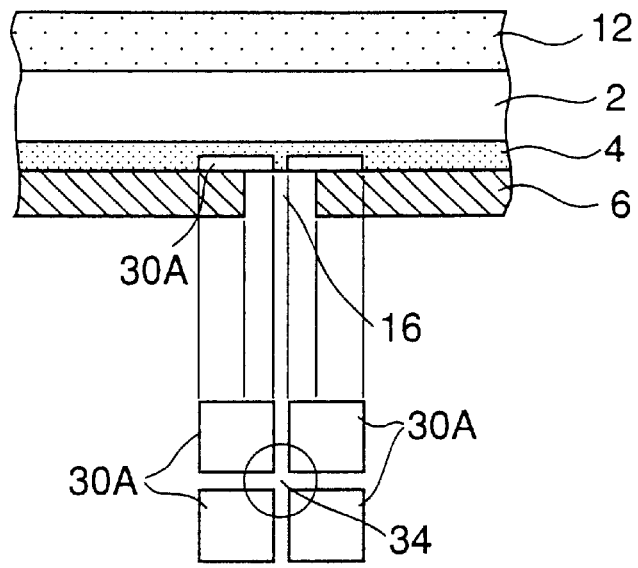
FIG. 7 is a cross-sectional view of a first variation of the pattern member shown in FIG. 6.

FIG. 7 is a cross-sectional view of a first variation of the pattern member 30. The part shown in FIG. 7 corresponds to the part shown in FIG. 6. In FIG. 7, a cross section of a pattern member 30A, which is the first variation of the pattern member 30, is indicated together with a plan view of the pattern member 30A.

The pattern member 30A has a square shape, and is formed so that a portion thereof covers the vent hole 16. Four pattern members 30A are formed for each of the vent holes 16, and are adjacent to each other with a narrow gap 34 therebetween. Each of the vent holes 16 is located in the middle of the four adjacent pattern members 30A so that each vent hole 16 is open only at the narrow gap 34.

In the above-mentioned structure, the gap 34 shown in FIG. 7 provides the same effect as that of the small hole 32 shown in FIG. 6. That is, each vent hole 16 is partially closed by the pattern members 30A so as to prevent the adhesive 4 from leaking while water vapor due to occurrence of the popcorn phenomenon is discharged to the vent hole 16 through the gap 34.

The pattern members 30A can be formed in a process similar to the process of forming the above-mentioned pattern members 30, and there is no need to provide a separate process of forming the pattern members 30A. Accordingly, the semiconductor device, in which separation of the adhesive is prevented while preventing leakage of the adhesive, can be manufactured without increasing a manufacturing cost.

Figure 8:
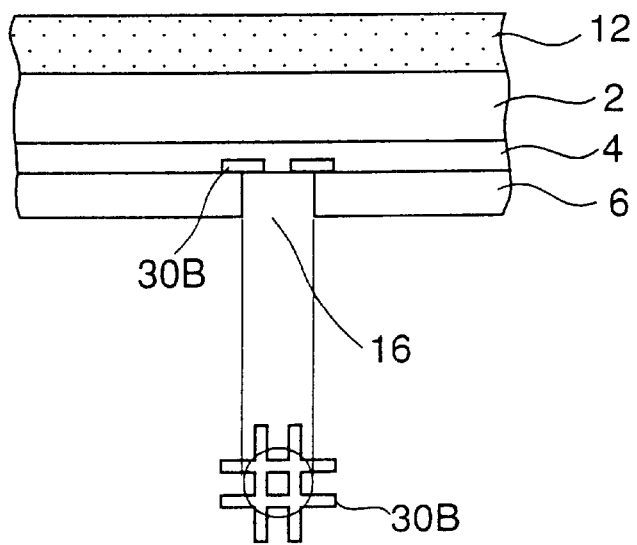
FIG. 8 is a cross-sectional view of a second variation of the pattern member shown in FIG. 6.

FIG. 8 is a cross-sectional view of a second variation of the pattern member 30. The part shown in FIG. 8 corresponds to the part shown in FIG. 6. In FIG. 8, a cross section of a pattern member 30B, which is the second variation of the pattern member 30, is indicated together with a plan view of the pattern member 30B.

The pattern member 30B is formed like a sharp sign, and a portion thereof covers the vent hole 16. One pattern member 30B is formed for each vent hole 16 so as to appropriately close a part of the vent hole 16 by the shape of the pattern member 30B. That is, each vent hole 16 is partially closed by the pattern members 30A so as to prevent the adhesive 4 from leaking while water vapor due to occurrence of the popcorn phenomenon is discharged to the vent hole 16 through the gap 34. That is, each vent hole 16 is partially closed by the pattern members 30B so as to prevent the adhesive 4 from leaking while water vapor due to occurrence of the popcorn phenomenon is discharged to the vent hole 16 through the portion which is not covered by the pattern member 30B.

The pattern members 30B can be formed in a process similar to the process of forming the above-mentioned pattern members 30, and there is no need to provide a separate process of forming the pattern members 30B. Accordingly, the semiconductor device, in which separation of the adhesive is prevented while preventing leakage of the adhesive, can be manufactured without increasing a manufacturing cost.

It should be noted that the shape of the pattern member 30B is not limited to the shape of the sharp sing, and an arbitrary shape can be adopted if an appropriate area of the vent hole 16 can be covered by the pattern member 30B.

Figure 9:
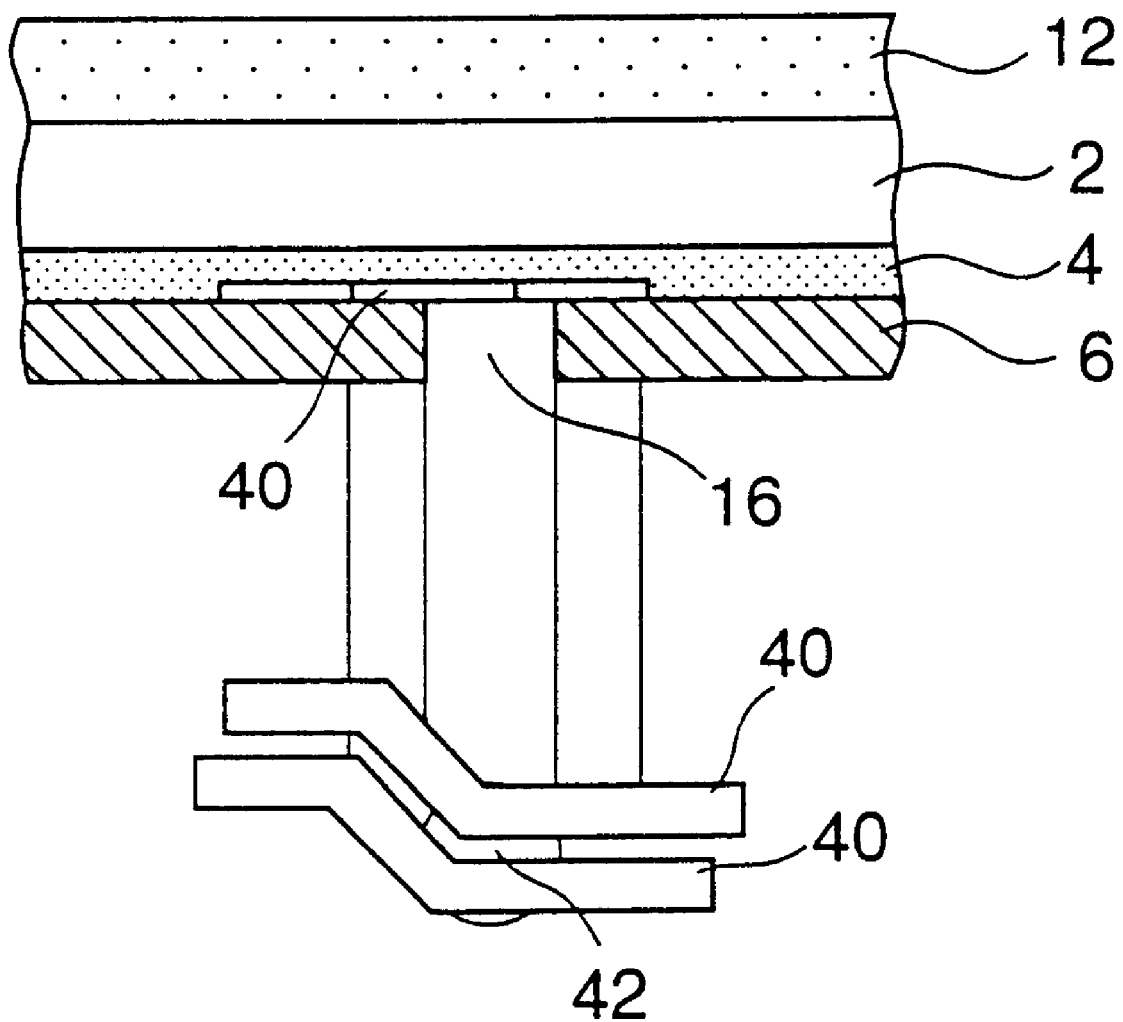
FIG. 9 is a cross-sectional view of a part of a semiconductor device according to a second embodiment of the present invention.

A description will now be given, with reference to FIG. 9, of a second embodiment of the present invention. FIG. 9 is a cross-sectional view of a part of a semiconductor device according to the second embodiment of the present invention. FIG. 9 also shows a plan view of a pattern member provided in the semiconductor device. In FIG. 9, parts that are the same as the parts shown in FIG. 5 are given the same reference numerals, and descriptions thereof will be omitted.

In the present embodiment, the vent holes 16 are covered by portions of wiring patterns 40. The wiring patterns 40 are actual wiring patterns, which are connected to the electrode pads 10. Accordingly, in this respect, the wiring patterns 40 are different from that of the above-mentioned first embodiment. That is, in the above-mentioned first embodiment, the pattern member is formed at a position where the wiring pattern and the electrode pads 10 are not located. However, in the present embodiment, the actual wiring patterns 40 are positively used as the pattern members so as to partially cover each of the vent holes 16 by portions of the wiring patterns 40.

Accordingly, the wiring patterns 40 are designed so as to be located evenly on the surface 6a of the substrate 6 so that each of the vent holes 16 is partially covered by portions of the wiring patterns 40. Thereby, there is no need to locate the vent holes 16 while keeping away from the wiring patterns 40, which improve a freedom of design.

In the example shown in FIG. 9, each vent hole 16 is partially covered by utilizing a gap between the adjacent wiring patterns 40. That is, the wiring patterns 40 are located at predetermined intervals so that the vent holes 16 are located between the wiring patterns 40.

In the present embodiment, there is no need to separately form the pattern members, which partially cover the vent holes 16, since the wiring patterns 40 partially cover the vent holes 16. Accordingly, the semiconductor device, in which separation of the adhesive is prevented while preventing the adhesive from leaking, can be manufactured without increasing a manufacturing cost.

In the first and second embodiments of the present invention, the description is related to the semiconductor device, in which the semiconductor chip 2 is mounted by a wire bonding method, as shown in FIG. 1. However, it is apparent that the present invention can be applied to a semiconductor device in which the semiconductor chip 2 is mounted by a flip chip bonding method, and a description thereof will be omitted.

Figure 10:
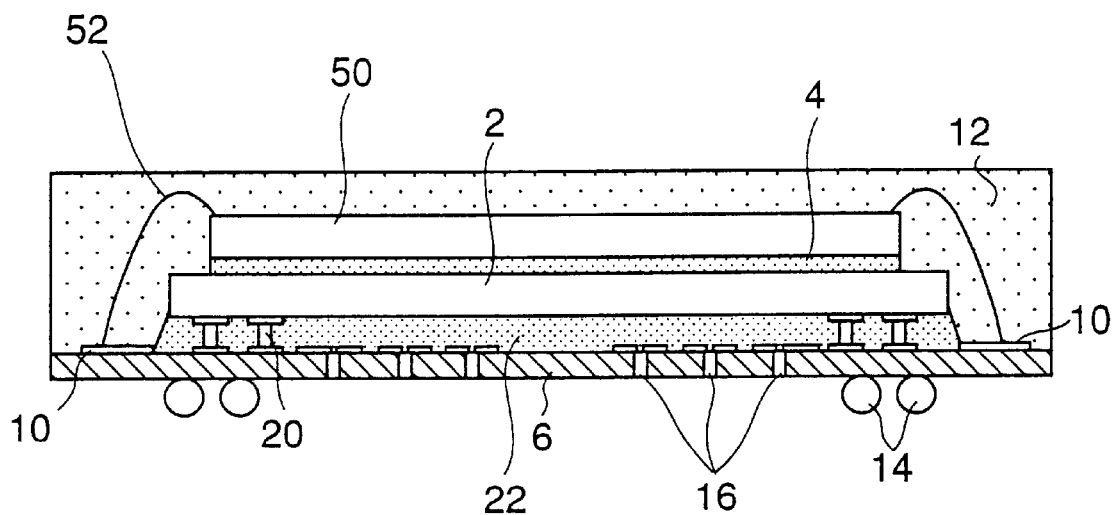
FIG. 10 is a cross-sectional view of an example of a stacked type semiconductor device formed by the semiconductor device according to the present invention.

FIG. 10 is a cross-sectional view of a semiconductor device to which the present invention is applied, which semiconductor device is manufactured by a flip chip bonding method. The semiconductor device shown in FIG. 10 is generally referred to as a stacked type semiconductor device in which an additional semiconductor chip 50 is stacked on the semiconductor chip 2, which is mounted to the substrate 6 by a flip chip mounting method. The upper semiconductor chip 50 is fixed onto the lower semiconductor chip 2 by an adhesive 4. Additionally, electrodes of the upper semiconductor chip 50 are connected to the electrode pads 10 of the substrate 6 by bonding wires 52.

Figure 11:
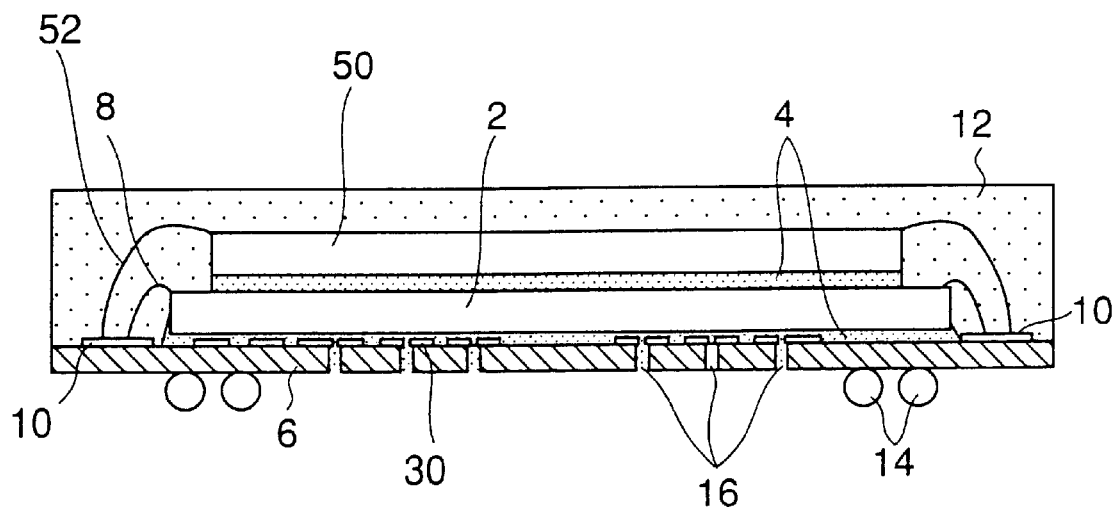
FIG. 11 is a cross-sectional view of another example of the stacked type semiconductor device formed by the semiconductor device according to the present invention.

FIG. 11 is a cross-sectional view of another semiconductor device to which the present invention is applied, which semiconductor device is manufactured by a wire bonding method. In the semiconductor device shown in FIG. 11, an additional semiconductor chip 50 is stacked on the semiconductor chip 2, which is mounted to the substrate 6 and electrically connected to the substrate 6 by bonding wires 8. The upper semiconductor chip 50 is fixed onto the lower semiconductor chip 2 by an adhesive 4. Additionally, electrodes of the upper semiconductor chip 50 are connected to the electrode pads 10 of the substrate 6 by bonding wires 52.

The present invention is not limited to the specifically disclosed embodiments, and variations and modifications may be made without departing from the scope of the present invention.

The present application is based on Japanese priority application No. 2000-146850 filed on May 18, 2000, the entire contents of which are hereby incorporated by reference.

What is claimed is:

1. A semiconductor device comprising:

a semiconductor element;

a substrate having a first surface on which the semiconductor element is fixed and a second surface opposite to the first surface;

an adhesive provided between said semiconductor element and said first surface of said substrate;

at least one though hole extending between said first surface and said second surface of said substrate; and a pattern member formed on said first surface of said substrate so as to cover a part but not the whole of an opening of said through hole.

2. The semiconductor device as claimed in claim 1, wherein said pattern member is formed of the same material as electrode pads formed on said first surface of said substrate.

3. The semiconductor device as claimed in claim 1, wherein said pattern member is a circuit pattern formed on said first surface of said substrate.

4. The semiconductor device as claimed in claim 1, wherein said substrate is an organic substrate formed of an organic material.

* * * * *